(12) United States Patent
Tavallaee et al.

(10) Patent No.: US 11,581,703 B2
(45) Date of Patent: Feb. 14, 2023

(54) EXTERNAL CAVITY LASER WITH A PHASE SHIFTER

(71) Applicant: SiLC Technologies, Inc., Monrovia, CA (US)

(72) Inventors: Amir Ali Tavallaee, San Francisco, CA (US); Behnam Behroozpour, South San Francisco, CA (US); Bradley Jonathan Luff, La Canada Flintridge, CA (US); Mehdi Asghari, La Canada Flintridge, CA (US)

(73) Assignee: SiLC Technologies, Inc., Monrovia, CA (US)

( * ) Notice: Subject to any disclaimer, the term of this patent is extended or adjusted under 35 U.S.C. 154(b) by 195 days.

(21) Appl. No.: 17/026,270

(22) Filed: Sep. 20, 2020

(65) Prior Publication Data

US 2022/0094140 A1    Mar. 24, 2022

(51) Int. Cl.

| | |
|---|---|
| *H01S 5/0683* | (2006.01) |
| *H01S 5/0687* | (2006.01) |
| *H01S 3/136* | (2006.01) |
| *H01S 3/10* | (2006.01) |
| *H01S 5/14* | (2006.01) |

(52) U.S. Cl.
CPC ...... *H01S 5/06835* (2013.01); *H01S 3/10053* (2013.01); *H01S 3/136* (2013.01); *H01S 5/0687* (2013.01); *H01S 5/141* (2013.01)

(58) Field of Classification Search
CPC .. H01S 5/06835; H01S 3/10053; H01S 3/136; H01S 5/0687; H01S 5/141; H01S 5/0622; H01S 3/106; H01S 5/005; H01S 5/021; H01S 5/0239; G01S 17/00; G01S 7/484; G01S 17/34; G01S 17/42
See application file for complete search history.

(56) References Cited

U.S. PATENT DOCUMENTS

| 5,289,252 A | 2/1994 | Nourrcier | |
|---|---|---|---|
| 8,885,678 B1 * | 11/2014 | Kupershmidt | ........ H01S 5/0687 372/29.016 |

(Continued)

OTHER PUBLICATIONS

Thomas, Shane, International Search Report and Written Opinion, PCT/US2021/059793, International Searching Authority, United States Patent and Trademark Office, May 4, 2022.

*Primary Examiner* — Xinning (Tom) Niu
(74) *Attorney, Agent, or Firm* — Gavrilovich, Dodd & Lindsey LLP

(57) ABSTRACT

Systems and methods described herein are directed to optical light sources, such as an external cavity laser (ECL) with an active phase shifter. The system may include control circuitry for controlling one or more parameters associated with the active phase shifter. The phase shifter may be a p-i-n phase shifter. The control circuitry may cause variation in a refractive index associated with the phase shifter, thereby varying a lasing frequency of the ECL. The ECL may be configured to operate as a light source for a light detection and ranging (LIDAR) system based on generating frequency modulated light signals. In some embodiments, the ECL may generate an output LIDAR signal with alternating segments of increasing and decreasing chirp frequencies. The ECL may exhibit increased stability and improved chirp linearities with less dependence on ambient temperature fluctuations.

20 Claims, 9 Drawing Sheets

(56) References Cited

U.S. PATENT DOCUMENTS

| | | | |
|---|---|---|---|
| 9,575,341 B2 | 2/2017 | Heck et al. | |
| 9,748,726 B1* | 8/2017 | Morton | H01S 3/083 |
| 2004/0085612 A1* | 5/2004 | Livingston | G02F 1/2257 |
| | | | 359/279 |
| 2010/0085992 A1* | 4/2010 | Rakuljic | G01S 7/4911 |
| | | | 372/20 |
| 2015/0378187 A1* | 12/2015 | Heck | G02B 6/12004 |
| | | | 250/227.21 |
| 2019/0027897 A1* | 1/2019 | Wei | G01S 7/497 |
| 2019/0280453 A1* | 9/2019 | Gopinath | H01S 5/06246 |

\* cited by examiner

600

800

EXTERNAL CAVITY LASER WITH A PHASE SHIFTER

FIELD

The invention relates to optical light sources and systems. In particular, the invention relates to laser devices for remote imaging applications.

BACKGROUND

With the advent of autonomous devices and systems, increasing attention has been placed on improving the performance of remote imaging systems. For example, remote imaging systems, such as Light Detection and Ranging (LiDAR) systems, are relying on increasingly sophisticated imagers that can resolve target features over tens of meters with millimeter-scale precision. Lasers are routinely used as the light sources for such LiDAR systems. Improvements in laser performance can significantly improve the performance of the imaging systems and in many cases, reduce costs of the imaging systems.

Recently, frequency modulated continuous wavelength (FMCW) LiDAR systems have been making significant in-roads into the remote imaging space due to several inherent advantages such as instantaneous velocity, depth, and target material-specific information associated with every target location imaged. Moreover, FMCW LiDAR systems can be immune to interference from other LiDAR systems operating over a common field-of-view (FOV) and can acquire images without a need for ambient lighting.

A common method for frequency modulating the laser light source of the FMCW LiDAR system includes amplitude modulation of a laser drive current. The modulation frequency for such amplitude modulation tends to be limited to hundreds of kHz due to a reliance on carrier injection and carrier depletion speeds associated with a gain medium of the laser. Carrier injection and depletion may also cause temperature variations and heat dissipation issues that further limit the rate at which the frequency of the laser may be varied or chirped. This may limit an overall speed of operation of the FMCW LiDAR system. As such, the limited amplitude modulation frequency of hundreds of kHz limits an overall speed of operation of the FMCW LiDAR system.

Variations in laser temperature during the carrier injection and depletion phases of the amplitude modulation of the laser drive current can further give rise to non-linearities in the laser chirp signal. For example, the chirp frequency of the laser may not linearly increase during an up-chirp portion and may not linearly decrease during a down-chirp portion of the laser signal. The chirp non-linearities can significantly affect FMCW LiDAR system performance by causing degradations in signal-to-noise (SNR) ratios, increase in false positives, decrease in target detection probabilities, reduction in a range of operation, and/or reduction in a speed of operation. Therefore, it is of increasing importance to enable highly linear chirp rates for FMCW lasers for supporting improved LiDAR performance.

SUMMARY

This summary is not intended to identify critical or essential features of the disclosures herein, but instead merely summarizes certain features and variations thereof. Other details and features will also be described in the sections that follow.

Some of the features described herein relate to an optical system including a laser that is positioned on a supportive base. The optical system may include circuits, electronics, memory, and/or processing elements for generating a laser signal. In some embodiments, the optical system may interface with a light detection and ranging (LIDAR) system for remote imaging applications.

The laser may be a tunable laser such as an external cavity laser (ECL) that may include a gain medium, phase shifter element, and a grating. The phase shifter element may be a p-i-n phase shifter that is positioned within a cavity region of the ECL.

The p-i-n phase shifter may include regions with contacts (e.g., metal contacts) for application of a voltage bias. Current injection and depletion from the p-i-n phase shifter may be controlled by varying the voltage applied to the contacts. The current injection and depletion from the p-i-n phase shifter may vary a corresponding refractive index profile thereby causing a change in the peak emission wavelength that can be supported by the laser cavity. The p-i-n phase shifter can thus cause the ECL to lase at different frequencies depending upon the variations in the refractive index that perturb the phase length of the laser cavity region. The ECL can then be used to generate a chirped laser output with good chirp linearity, narrow linewidths, and/or increased chirp rates. This can enable the development of high-performance FMCW LIDAR systems that exhibit high SNRs, fast scanning speeds, high precision, and/or improved accuracies without increasing costs.

BRIEF DESCRIPTION OF THE DRAWINGS

Some features herein are illustrated by way of example, and not by way of limitation, in the figures of the accompanying drawings and in which like reference numerals refer to similar elements.

DETAILED DESCRIPTION

Figure 1:
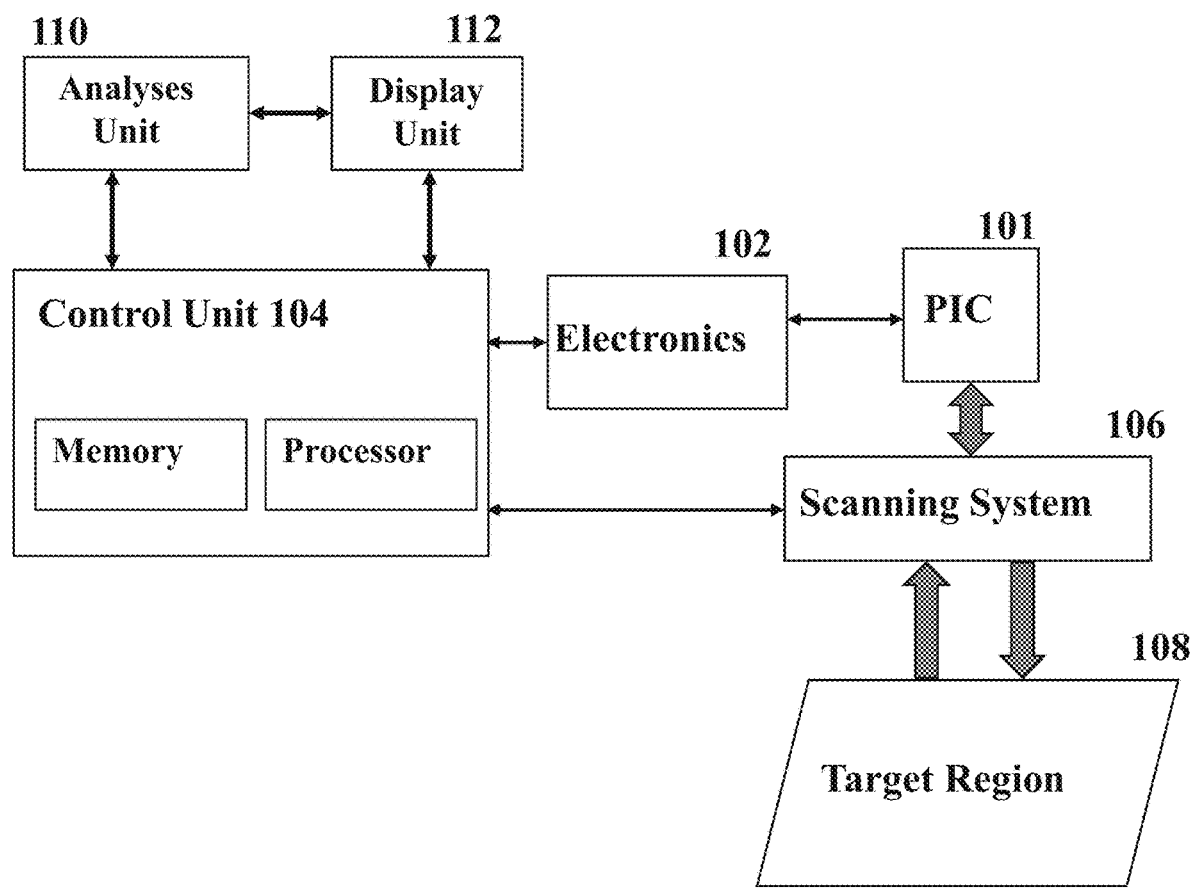
FIG. 1 shows the remote imaging system in accordance with various embodiments described herein.

Example embodiments will now be described more fully with reference to the accompanying drawings. Many alternate forms may be embodied, and example embodiments should not be construed as limited to example embodiments set forth herein. In the drawings, like reference numerals refer to like elements.

As used herein, the term "and/or" includes any and all combinations of one or more of the associated items. Unless specifically stated otherwise, or as is apparent from the discussion, terms such as "processing" or "computing" or "calculating" or "determining" or "displaying" or the like, refer to the action and processes of a computing system, or similar electronic computing device, that manipulates, and transforms data represented as physical, electronic quantities within the computing system's registers and memories into other data similarly represented as physical quantities within the computing system's memories or registers or other such information storage, transmission or display devices.

In the following description, illustrative embodiments will be described with reference to symbolic representations of operations (e.g., in the form of flow charts) that may be implemented as program modules or functional processes including routines, programs, objects, components, data structures, etc. that perform particular tasks or implement particular abstract data types and may be implemented using hardware in electronic systems (e.g., an imaging and display device). Such existing hardware may include one or more digital signal processors (DSPs), application-specific integrated circuits (ASICs), field programmable gate arrays (FPGAs), central processing units (CPUs), or the like.

The term "storage medium," "computer readable storage medium" or "non-transitory computer readable storage medium" may represent one or more devices for storing data, including read only memory (ROM), random access memory (RAM), magnetic RAM, magnetic disk storage memory, optical storage mediums, flash memory devices and/or other tangible machine readable mediums for storing information. The term "computer-readable memory" may include, but is not limited to, portable or fixed storage devices, optical storage devices, and various other mediums capable of storing, containing or carrying instructions and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium. When implemented in software, a processor(s) may be programmed to perform the necessary tasks, thereby being transformed into special purpose processor(s) or computer(s).

FIG. 1 shows a schematic illustration of a remote imaging system 100 that includes a photonic integrated circuit (PIC) 101 in communication with a scanning system 106, electronics 102, control unit 104, an analyses unit 110, and/or a display unit 112. The PIC 101 may include a tunable laser, either on-chip or off-chip, along with a plurality of photonic components such as waveguides, splitters, directional couplers, interferometers (e.g., Mach-Zehnder interferometers), and photodetectors for generating, transmitting, and/or receiving light signals. The PIC 101 may include an optical amplifier along an optical output path. The tunable laser may include a phase shifter element consisting of a p-doped silicon (p) region, an intrinsic silicon (i) region, and an n-doped silicon (n) region to form a p-i-n structure. In some embodiments, the tunable laser may be an ECL. In some embodiments, the p-i-n phase shifter element may be separate from the laser.

The scanning system 106 may include a mechanism for steering an optical light output from the PIC, such as a scanner. Examples of scanners include micro-electro-mechanical system (MEMS) mirrors, arrayed waveguide gratings, and optical phased arrays. The imaging system 100 may further include optics (e.g., collimators, lenses, etc.), and various other processing elements (e.g., DSPs, ASICs, CPUs, FPGAs, circuits, memory, etc.). In some embodiments, the imaging system may include one or more communication interfaces such as graphical user interfaces (GUIs).

The PIC 101 may interface with the electronics 102 and the control unit 104 that can include memory, such as the non-transitory computer readable storage medium described above, in communication with various processing elements (e.g., electrical circuits, microprocessors, DSPs, ASICs, FPGAs, CPUs). Although the electronics are illustrated as a single component in a single location, the electronics may include multiple different components that are independent of one another and/or placed in different locations. Additionally, as noted above, all or a portion of the disclosed electronics may be included on the chip including electronics that may be integrated with the chip.

The imaging system 100 may be configured to scan a target region 108 based on controlling one or more photonic components of the PIC 101 and/or the scanning system 106. For example, the imaging system 100 may generate an outgoing chirped laser signal that is configured to scan the target region 108 over a FOV of approximately 10 degrees to 180 degrees at approximate scan speeds of 50 Hz up to several kHz for the fast axis and a few Hz to tens of Hz for the slow axis. The FOV may be a dynamically adjusted parameter. The scanned data based on reflected laser signals can be processed via the control unit 104 and the analysis unit 110 and then displayed via the display unit 112 (e.g., monitor, laptop, video screen, projector, AR/VR device, etc.).

In some embodiments, the imaging system 100 may include a Frequency Modulated Continuous Wave (FMCW) LIDAR system and the PIC 101 may be part of a LIDAR chip. The LIDAR system may generate an output light signal such as a LIDAR output signal that is frequency modulated over different chirp durations. For example, the frequency may linearly increase and the wavelength may linearly decrease over a first chirp duration, ($t_1$). The frequency may linearly decrease and the wavelength may linearly increase over a second chirp duration ($t_2$). This may vary a wavelength of the LIDAR output signal over different chirp durations. For example, the wavelength of the LIDAR output signal may vary between 1200 nm to 1320 nm, 1400 nm to 1590 nm, and 1900 to 2100 nm depending upon the wavelength range of operation of the tunable laser. In some embodiments, one or more tunable lasers may be configured to generate multiple LIDAR output signals with wavelengths associated with a 1200 nm to 1320 nm range, a 1400 nm to 1590 nm range, and/or a 1900 nm to 2100 nm range.

The first chirp duration with the linearly increasing outgoing LIDAR signal frequency may be referred to as an up-ramp chirp and the second chirp duration with the linearly decreasing signal frequency may be referred to as a down-ramp chirp. The LIDAR system may be configured to estimate a target range and/or velocity based on at least one chirp duration.

The control unit 104 may be configured to cause the scanning system 106 to control the scanning of different target regions based on steering the outgoing LIDAR signal. The target regions can each be associated with at least one data cycle and/or each data cycle can be associated with one of the target regions. As a result, each LIDAR data result can be associated with one of the target regions. Different target regions may have some overlap or be distinct from one another. For data cycles that include two chirp durations, each data point for a target region may be associated with two chirp durations. For data cycles that include three chirp durations, each data point for a target region may be associated with three chirp durations.

Figure 2:
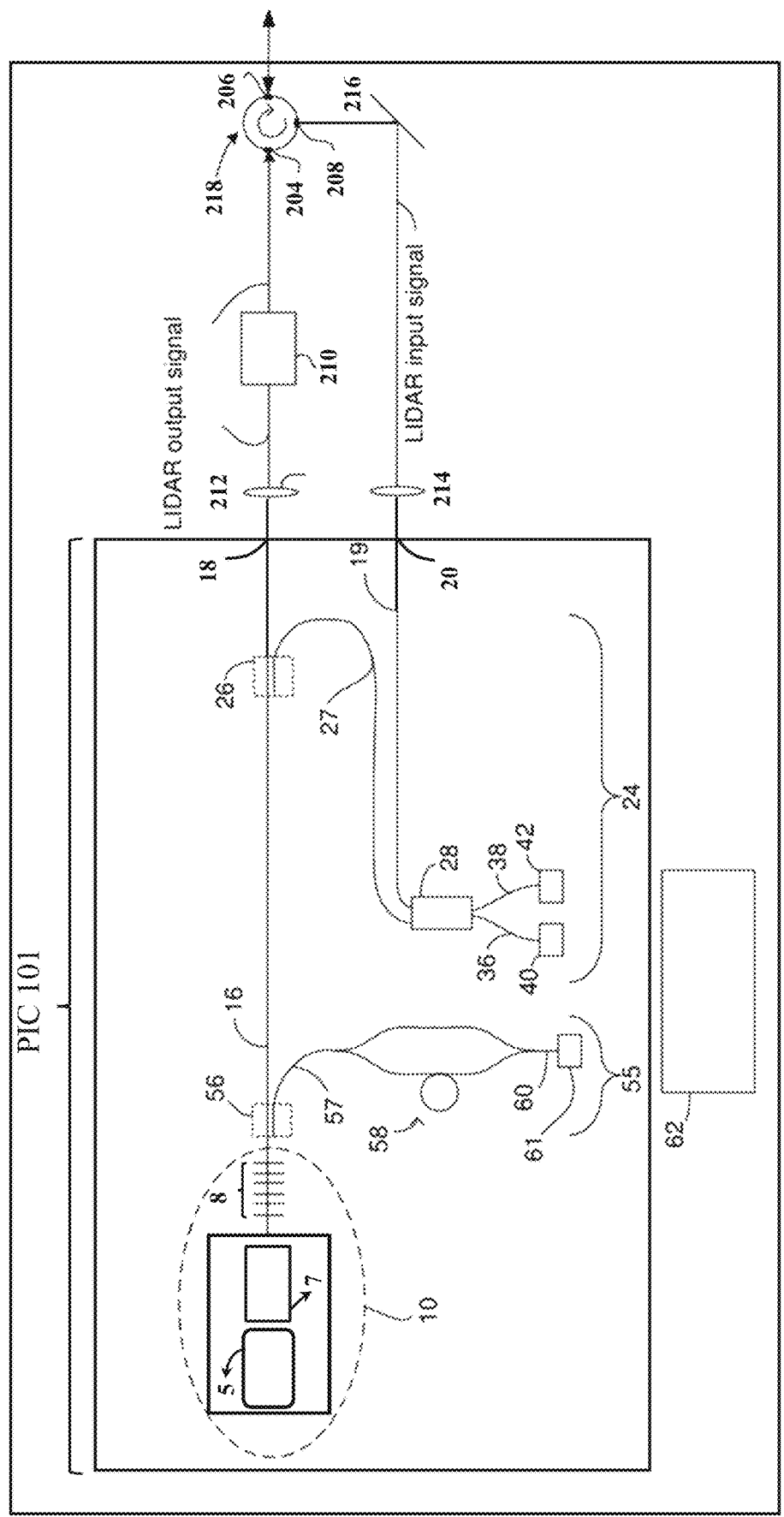
FIG. 2 shows an example illustration of a remote imaging device including the tunable laser with the phase shifter.

FIG. 2 shows a schematic illustration of a LIDAR chip that includes a light source 10 (e.g., ECL) and a plurality of photonic components such as an output waveguide 16, an input waveguide 19, a reference waveguide 27, light-combining component 28, splitters 56 and 26, and an interferometer 58. As described earlier with respect to FIG. 1, the LIDAR chip may include the PIC 101. The ECL 10 may include a gain chip 5, one or more mirrors for controlling a wavelength dependent optical feedback into the ECL, a grating 8, and a phase shifter element 7. In some embodiments, the phase shifter element 7 may be a part of the gain chip 5. The ECL 10 may be fabricated separately and integrated onto the PIC 10. In some embodiments, the grating 8 may be fabricated along with the PIC 10 and separately from the fabrication of the ECL 10.

As described earlier, the phase shifter element may be a based on a p-i-n structure with metal contacts for providing appropriate bias control. The p-i-n structure may consist of a p-doped silicon (p) region, an intrinsic silicon (i) region, and an n-doped silicon (n) region.

Control electronics 62 may be located off the LIDAR chip and used to control a laser drive current associated with the optical gain medium 5 and/or determine operation of the phase shifter 7. For example, the control electronics 62 may vary the laser drive current (e.g., 1 mA to 50 mA peak-to-peak) to control current injection into the optical gain medium, thereby varying an optical gain associated with the gain medium 5. Once the laser drive current exceeds a predetermined threshold level associated with population inversion in the optical gain medium, the ECL 10 may begin to lase and generate a narrow line-width spectrum. The peak wavelength emission of the ECL 10 may be referred to as the lasing wavelength that can be controlled based on controlling current injection into the gain medium. As such, the peak lasing wavelength can be selected based on the laser drive current. For example, the ECL 10 may begin to lase at a wavelength of approximately 1500 nm after application of an amplitude modulated laser drive current exceeding 10 mA peak-to-peak.

The voltage bias across the phase shifter 7 can then control the frequency modulation of the lasing wavelength by either increasing the frequency of the lasing wavelength during the up-chirp duration or decreasing the frequency of the lasing wavelength during the down-chirp duration. The voltage bias across the phase shifter 7 may vary between approximately 0.7 V and 1 V. The frequency modulation of the ECL 10 emission's may be given by (f±Δf), wherein f is the selected peak lasing frequency corresponding to a peak lasing wavelength λ, (e.g., 1500 nm, 1310 nm, etc.) and Δf may correspond to a wavelength modulation Δλ that can depend on the modulation of the phase shifter's refractive index. For example, the peak lasing wavelength of the ECL 10 may be varied between a few picometer to hundreds of picometer. In some embodiments, the ECL 10 may exhibit Δλ up to 500 pm for a central lasing wavelength of approximately 1500 nm. In some other embodiments, the ECL 10 may exhibit Δλ up to 200 pm for a central lasing wavelength of approximately 1310 nm.

In some embodiments, the LIDAR chip may interface with an adapter 202 that includes collimating and/or focusing optics for directing the LIDAR output signal and an incoming LIDAR input signal onto the corresponding waveguide facets of the LIDAR chip. The output of the tunable ECL 10 may be coupled into the output waveguide 16 that terminates at a facet 18 of the LIDAR chip. The waveguide 16 may transmit the coupled light output from the tunable ECL 10 to the chip facet 18. For example, the waveguide 16 may transmit the coupled laser output from the tunable ECL 10 to an edge of the LIDAR chip that may include the chip facet 18. Accordingly, the waveguide 16 may terminate at the facet 18 that may be referred to as a terminating facet associated with the waveguide 16.

The light output transmitted from the facet 18 can serve as the outgoing LIDAR signal emitted from the LIDAR chip. Accordingly, the outgoing LIDAR signal may include the output of the ECL 10 that varies in wavelength depending upon the voltage bias applied to the phase shifter 7. For example, the ECL 10 may generate a laser output signal with a wavelength varying between approximately 1548 nm and 1549 nm. As another example, the tunable ECL may generate a laser output signal with a wavelength varying between 1549 nm and 1550 nm. The corresponding voltage bias applied to the phase shifter 7 may vary between 0.7 V to 1 V.

The control electronics 62 may vary application of the voltage bias (e.g., 0.7 V to 1 V) to the phase shifter 7. For example, under application of a forward bias of approximately 0.8 V, current injection into the phase shifter may increase sufficiently to cause a change in the phase length of the overall ECL cavity for the lasing wavelength of approximately 1500 nm. For example, the forward bias of the phase shifter 7 may cause a phase shift that is approximately equal to π or 180 degrees associated with the lasing wavelength. This can cause the longitudinal lasing mode supported by the external cavity region to change from 1500 nm to 1500.10 nm. The current injection may vary between a few mA up to 50 mA. In some embodiments, the current injection into the phase shifter during application of the forward bias voltage can cause a corresponding change in the refractive index of the phase shifter section that in turn causes the change in the phase length of the overall ECL cavity.

By precisely monitoring the injection current, the corresponding refractive index variations, and the respective phase change in the length of the ECL cavity, device simulations of the ECL may provide insights into optimization the dimensions of the phase shifter section. Further details associated with the dimensions of the ECL and the phase shifter are described with respect to FIGS. 5 and 6.

The ECL 10 may show improved performance on various fronts based on a phase change section that is separate from the gain medium section. This may be in contrast to an ECL that relies on modulation of the gain section for achieving frequency modulation associated with the laser output. For example, some prior art systems may incorporate amplitude modulation of the laser drive current in order to achieve frequency modulation of the laser output. Such systems may be severely limited in their chirp rate, laser linearity, and may require much higher laser drive currents for enabling stable, mode-free operation. The ECL 10 described herein can show improvements with respect to required laser drive currents for achieving stable lasing. Instead of high laser drive currents exceeding 20 mA peak-to-peak associated with laser systems that rely on amplitude modulation of the laser drive currents, the ECL 10 can operate within a mode-hop free, stable region with laser drive currents as low as 1 mA up to 10 mA peak-to-peak. This shows that the ECL 10 with the separate phase change section of the phase shifter 7 can operate with significantly lower laser drive currents with improved stability and without the need for amplitude modulation of the laser drive current.

Additional performance improvements may be associated with improved chirp linearity, higher chirp rates, and improved reliability. For example, the ECL 10 may achieve chirp linearities between 0.1 percent and 0.001 percent. As another example, the ECL 10 may be able to operate at chirp rates exceeding 500 kHz and up to several MHz.

The LIDAR chip of FIG. 2 may be associated with LIDAR chips described in related applications bearing application Ser. Nos. 16/547,522 and 16/726,235, disclosed herein in their entirety.

In some embodiments, the LIDAR chip may include an amplifier positioned along the output path of the LIDAR output signal and before the facet 18. For example, the output waveguide 16 may carry the LIDAR output signal to the amplifier and an amplified LIDAR output signal may then exit the LIDAR chip from the facet 18. Electronics 102 may be configured to control the amplifier operation and/or control a power of the LIDAR output signal. Examples of amplifiers include, but are not limited to, Erbium-doped fiber amplifiers (EDFAs), Erbium-doped waveguide amplifiers (EDWAs), and Semiconductor Optical Amplifiers (SOAs). In some embodiments, the amplifier may be a discrete component that is attached to the chip. The discrete amplifier may be positioned at any location on the LIDAR chip along the path of the LIDAR output signal. In some embodiments, all or a portion of the amplifier may be fabricated as along with the LIDAR chip as an integrated on-chip component. The LIDAR chip may be fabricated from various substrate materials including, but not limited to, silicon dioxide, indium phosphide, and silicon-on-insulator (SOI) wafers. Examples of splitters 56 and 26 include, but are not limited to, y-junctions, optical couplers, and MMIs.

In some embodiments, a LIDAR adapter may be positioned between the LIDAR chip and the scanning module 106. The LIDAR adapter may include optics, such as lenses 212 and 214, a circulator 218, mirror(s) 216 and an amplifier 210. The LIDAR output signal may then exit the LIDAR chip through the facet 18 and enter the circulator 218 through port 204 after passing through the lens 212. The circulator 218 may then direct the LIDAR output signal to the scanning module 106 via a port 206 of the circulator. In some instances, if no amplifier is present along the output waveguide 16, the amplifier 210 may be positioned in the path of the LIDAR output signal and between the lens 212 and the circulator 218 for amplifying the LIDAR output signal. The lens 212 may then focus the LIDAR output signal onto an entry port of the amplifier 210. In some instances, the components of the LIDAR adapter may be positioned on a support base.

The scanning module 106 may then direct the LIDAR output signal towards a targeted FOV and direct the returning LIDAR signals associated with the LIDAR output signal back to the circulator port 206. Accordingly, the port 206 of the circulator 218 may be configured to output LIDAR signals and receive LIDAR input signals simultaneously. In some instances, the port 206 of the circulator 218 may be connected to a fiber (e.g., polarization maintaining optical fiber) that outputs and/or receives LIDAR signals via a collimator positioned between the LIDAR adapter and the scanning module 106.

The returning LIDAR signals may be associated with reflection(s) of the LIDAR output signal off one or more objects located in the targeted FOV. The returning LIDAR signals may be redirected by the scanning module 106 to the collimator that may focus the signals onto the port 206 of the circulator 218. The circulator 218 can be configured to direct the returning LIDAR signals, as LIDAR input signals to lens 214 via port 208. The lens 214 may then focus the LIDAR input signals onto a facet 20 of an input waveguide 19 of the LIDAR chip. In some instances, the adapter 202 may include one or more mirrors, such as mirror 216, for changing a respective direction of the LIDAR signals. For example, the adapter 202 may include the mirror 216 mirror as a direction-changing component that redirects the LIDAR input signal from the port 208 of the circulator 218 to the facet 20 of the input waveguide 19.

A first LIDAR input signal that enters the input waveguide 19 may be associated with a first object located closest to the LIDAR chip while a second LIDAR input signal that enters the input waveguide 19 after some short delay may be associated with a second object located further away from the LIDAR chip. The arrival delay between the first LIDAR input signal and the second LIDAR input signal may be proportional to a line-of-sight distance between the first object and the second object relative to a location of the LIDAR chip.

In some instances, the LIDAR adapter may include waveguides for guiding the LIDAR signals. In some other instances, the optical path that the LIDAR input signals and the LIDAR output signal travel between components on the LIDAR adapter and/or between the LIDAR chip and a component on the LIDAR adapter, can be free space.

The input waveguide 19 may transmit the first LIDAR input signal to a light-combining component 28 (e.g., multi-mode interference device (MMI), adiabatic splitter, and/or directional coupler) that may be a part of a data branch 24 of the LIDAR chip. In some embodiments, the light-combining component 28 may be an MMI device such as a 2×2 MMI device. The functions of the illustrated light-combining component 28 can be performed by more than one optical component.

The data branch 24 may include photonic components that guide and/or modify the optical LIDAR signals for the LIDAR chip. The photonic components of the data branch may include a splitter 26, a reference waveguide 27, the light-combining component 28, a first detector waveguide 36, a second detector waveguide 38, a first light sensor 40, and a second light sensor 42.

The splitter 26 may transmit a portion of the outgoing LIDAR signal from the utility waveguide 16 into the reference waveguide 27. The illustrated splitter 26 may be an optical coupler that operates as a result of positioning the utility waveguide 16 sufficiently close to the reference waveguide 27 so that a portion of the light from the utility waveguide 16 couples into the reference waveguide 27. However, other signal tapping components, such as y-junctions, optical couplers, and MMIs can be used to couple a portion of the light signal from the utility waveguide 16 into the reference waveguide 27.

The portion of the outgoing LIDAR signal transmitted to the reference waveguide 27 may be referred to as a reference signal. The reference waveguide 27 carries the reference signal to the light-combining component 28.

In some embodiments, if the light-combining component 28 is a 2×2 MMI, the first LIDAR input signal and the reference signal may couple into the two inputs of the 2×2 MMI via the input waveguide 19 and the reference waveguide 27 respectively. The two input light signals may then interfere as they travel along the two arms of the MMI resulting in each output of the MMI carrying a combined portion of both the first LIDAR input signal and the reference signal. For example, the output light signal associated with the first arm of the MMI may include a portion of the first LIDAR input signal and a portion of the reference signal and the output light signal associated with the second arm of the MMI may include a remaining portion of the first LIDAR input signal and a remaining portion of the reference signal. In some embodiments, there may be a phase shift (e.g, 0 to π) between output light signals of the first arm and the second arm of the MMI. The output light signals associated with the two arms of the MMI may be referred to as a first composite signal and a second composite signal, wherein the first and the second composite signals including portions of the first LIDAR input signal and portions of the reference signal. The first composite signal may couple into a first detector waveguide 36 and the second composite signal may couple into a second detector waveguide 38. The first detector waveguide 36 may then transmit the first composite signal to the first light sensor 40 and the second detector waveguide 38 may transmit the second composite signal to the second light sensor 42.

The first light sensor 40 may then convert the first composite signal into a first electrical signal. The second light sensor 42 may convert the second composite signal into a second electrical signal. For example, the first light sensor 40 and the second light sensor 42 respectively convert the first composite signal and the second composite signal into photodetector currents that vary in time. Examples of the light sensors include photodiodes (PDs), and avalanche photodiodes (APDs).

In some embodiments, the first light sensor 40 and the second light sensor 42 may be configured as balanced photodetectors in a series arrangement to cancel out direct current (DC) components associated with their respective photocurrents. The balanced photodetector configuration can reduce noise and/or improve detection sensitivities associated with the photodetectors.

In some embodiments, the light-combining component 28 need not include light-splitting functionality. As a result, the illustrated light light-combining component 28 can be a 2×1 light-combining component rather than the illustrated 2×2 light-combining component and a single light sensor can replace the first light sensor 40 and the second light sensor 42 to output a single data signal. For example, the illustrated light light-combining component can be a 2×1 MMI device with two input arms and one output arm. If the light combining component is a 2×1 MMI, the chip can include a single detector waveguide, instead of the first and second detector waveguides, that carries a single composite signal, from the output arm of the 2×1 MMI, to the single light sensor.

The LIDAR chip can include a control branch 55 for controlling operation of the light source 10. The control branch may include a directional coupler 56 that can couple a portion of the outgoing LIDAR signal from the utility waveguide 16 into a control waveguide 57. The coupled portion of the outgoing LIDAR signal transmitted via the control waveguide 57 serves as a tapped signal. In some embodiments, other signal-tapping photonic components, such as y-junctions and/or MMIs, may be used in place of the directional coupler 56 illustrated in FIG. 1.

The control waveguide 57 can carry the tapped signal to an interferometer 58 that splits the tapped signal and then re-combines different portions of the tapped signal that are respectively offset in phase with respect to each other. The interferometer 58 may be a Mach-Zhender interferometer (MZI) comprising two unequal arms along which the split-up portions of the input signal travel before re-combining (e.g., interfering) towards the end; however, other interferometer configurations may be used. The interferometer signal output may be characterized by an intensity that is largely a function of the frequency of the tapped outgoing LIDAR signal. For example, the MZI may output a sinusoidal signal characterized by a fringe pattern.

The sinusoidal signal from the interferometer 58 can couple into an interferometer waveguide 60 and can function as an input to a control light sensor 61. The control light sensor 61 may convert the sinusoidal light signal into an electrical signal that can serve as an electrical control signal. Changes to the frequency of the outgoing LIDAR signal will cause changes to the frequency of the control light signal. Accordingly, the frequency of the electrical control signal output from the control light sensor 61 is a function of the frequency of the outgoing LIDAR signal. Other detection mechanisms can be used in place of the control light sensor 61. For example, the control light sensor 61 can be replaced with a balanced photodetector arrangement including two light sensors arranged in series as described earlier with respect to the balanced photodetector arrangement of the first light sensor 40 and the second light sensor 42.

Electronics 62 can operate one or more components on the chip. For example, the electronics 62 can be in electrical communication with and control operation of the light source 10, the first light sensor 40, the second light sensor 42, and the control light sensor 61. Although the electronics 62 are shown off the chip, all or a portion of the electronics can be included on the chip. For example, the chip can include electrical conductors that connect the first light sensor 40 in series with the second light sensor 42. In some embodiments, the control electronics 102 may be include the electronics 62.

In some embodiments, the electronics may control the chirp frequency and/or the chirp duration of the outgoing LIDAR signal as described earlier with respect to FIG. 1. The electronics 62 may operate the LIDAR chip through a series of data cycles, wherein LIDAR data is generated for each (radial distance and/or radial velocity between the LIDAR system and a reflecting object) data cycle. A duration of each data cycle may correspond to the chirp duration of either increasing or decreasing chirp frequency of the outgoing LIDAR signal and thereby, the LIDAR output signal.

In some embodiments, each data cycle may correspond to one or more chirp durations thereby including one or more data periods that respectively correspond to increasing or decreasing chirp frequencies of the outgoing LIDAR signal. For example, one data cycle may correspond to two chirp durations effectively encompassing an up-ramp chirp duration and a down-ramp chirp duration. As another example, one data cycle may correspond to three chirp durations effectively encompassing an up-ramp, down-ramp and another up-ramp chirp duration.

During each data period, the electronics 62 may tune the chirp frequency of the outgoing LIDAR signal. As will be described in more detail below, the electronics 62 can employ output from the control branch in order to control the chirp frequency of the outgoing LIDAR signal such that the chirp frequency of the outgoing LIDAR signal, and consequently the LIDAR output signal, as a function of time is known to the electronics. In some instances, a data cycle includes a first data period, such as a first chirp duration, and a second data period, such as a second chirp duration. During the first chirp duration, the electronics 62 may increase the frequency of the outgoing LIDAR signal and during the second chirp duration the electronics 62 may decrease the frequency of the outgoing LIDAR signal or vice versa.

When the outgoing LIDAR signal frequency is increased during the first chirp duration, the LIDAR output signal travels away from the LIDAR chip and an object positioned in a sample region of a field of view may reflect light from the LIDAR output signal. At least a portion of the reflected light is then returned to the chip via the first LIDAR input signal as described earlier. During the time that the LIDAR output signal and the first LIDAR input signal are traveling between the chip and the reflecting object, the frequency of the outgoing LIDAR signal may continue to increase. Since a portion of the outgoing LIDAR signal is tapped as the reference signal, the frequency of the reference signal continues to increase. As a result, the first LIDAR input signal enters the light-combining component 28 with a lower frequency than the reference signal concurrently entering the light-combining component. Additionally, the further the reflecting object is located from the chip, the more the frequency of the reference signal increases before the first LIDAR input signal returns to the chip because the further the reflecting object is located, the greater will be the round-trip delay associated with the outgoing LIDAR signal exiting the LIDAR chip as the LIDAR output signal and returning as the first LIDAR input signal. Accordingly, the larger the difference between the frequency of the first LIDAR input signal and the frequency of the reference signal, the further the reflecting object is from the chip. As a result, the difference between the frequency of the first LIDAR input signal and the frequency of the reference signal is a function of the distance between the chip and the reflecting object.

For the same reasons, when the outgoing LIDAR signal frequency is decreased during the second data period, the first LIDAR input signal enters the light-combining component with a higher frequency than the reference signal concurrently entering the light-combining component and the difference between the frequency of the first LIDAR input signal and the frequency of the reference signal during the second data period is also function of the distance between the LIDAR system and the reflecting object.

In some instances, the difference between the frequency of the first LIDAR input signal and the frequency of the reference signal can also be a function of the Doppler effect because relative movement of the LIDAR system and the reflecting object can also affect the frequency of the first LIDAR input signal. For instance, when the LIDAR system is moving toward or away from the reflecting object and/or the reflecting object is moving toward or away from the LIDAR system, the Doppler effect can affect the frequency of the first LIDAR input signal. Since the frequency of the first LIDAR input signal is a function of the radial velocity between the reflecting object and the LIDAR system, the difference between the frequency of the first LIDAR input signal and the frequency of the reference signal is also a function of the radial velocity between the reflecting object and the LIDAR system. Accordingly, the difference between the frequency of the first LIDAR input signal and the frequency of the reference signal is a function of the distance and/or radial velocity between the LIDAR system and the reflecting object.

The composite signal may be based on interference between the first LIDAR input signal and the reference signal that can occur within the light-combining component 28. For instance, since the 2×2 MMI guides the first LIDAR input signal and the reference signal over two paths in close proximity to each other, and these signals have different frequencies, there is beating between the first LIDAR input signal and reference signal. Accordingly, the composite signal can be associated with a beat frequency related to the frequency difference between the first LIDAR input signal and the reference signal and the beat frequency can be used to determine the difference in the frequency between the first LIDAR input signal and the reference signal. A higher beat frequency for the composite signal indicates a higher differential between the frequencies of the first LIDAR input signal and the reference signal. As a result, the beat frequency of the data signal is a function of the distance and/or radial velocity between the LIDAR system and the reflecting object.

The beat frequencies ($f_{LDP}$) from two or more data periods or chirp durations may be combined to generate LIDAR data that may include frequency domain information, distance and/or radial velocity information associated with the reflecting object. For example, a first beat frequency that the electronics 62 determine from a first data period ($DP_1$) can be combined with a second beat frequency that the electronics determine from a second data period ($DP_2$) to determine a distance of the reflecting object from the LIDAR system and in some embodiments, a relative velocity between the reflecting object and the LIDAR system.

The following equation can apply during the first data period during which the electronics 62 may linearly increase the frequency of the outgoing LIDAR signal: $f_{ub}=-f_d+\alpha\tau$, where $f_{ub}$ is the beat frequency, and fa represents the Doppler shift ($f_d=2vf_c/c$), where $f_c$ represents the optical frequency ($f_o$), c represents the speed of light, v is the radial velocity between the reflecting object and the LIDAR system where the direction from the reflecting object toward the chip is assumed to be the positive direction. The following equation can apply during the second data period where electronics linearly decrease the frequency of the outgoing LIDAR signal: $f_{db}=-f_d-\alpha\tau$, where $f_{db}$ is the beat frequency. In these two equations, $f_d$ and $\tau$ are unknowns. The electronics 62 can solve these two equations for the two unknowns. The radial velocity for the reflecting object with the sampled region can then be determined from the Doppler shift ($v=c*f_d/(2f_c)$) and the separation distance between the reflecting object in that sampled region and the LIDAR chip can be determined from $c*f_\tau/2$.

In instances where the radial velocity between the LIDAR chip and the reflecting object is zero or very small, the contribution of the Doppler effect to the beat frequency is essentially zero. In these instances, the Doppler effect may not make a substantial contribution to the beat frequency and the electronics 62 may use the first data period to determine the distance between the chip and the reflecting object.

During operation, the electronics 62 can adjust the frequency of the outgoing LIDAR signal in response to the electrical control signal output from the control light sensor 61. As noted above, the magnitude of the electrical control signal output from the control light sensor 61 is a function of the frequency of the outgoing LIDAR signal. Accordingly, the electronics 62 can adjust the frequency of the outgoing LIDAR signal in response to the magnitude of the control. For instance, while changing the frequency of the outgoing LIDAR signal during a data period, the electronics 62 can have a range of preset values for the electrical control signal magnitude as a function of time. At multiple different times during a data period, the electronics 62 can compare the electrical control signal magnitude to the range of preset values associated with the current time in the sample. If the electrical control signal magnitude indicates that the frequency of the outgoing LIDAR signal is outside the associated range of electrical control signal magnitudes, the electronics 62 can operate the light source 10 so as to change the frequency of the outgoing LIDAR signal so it falls within the associated range. If the electrical control signal magnitude indicates that the frequency of the outgoing LIDAR signal is within the associated range of electrical control signal magnitudes, the electronics 62 may not change the frequency of the outgoing LIDAR signal.

Figure 3:
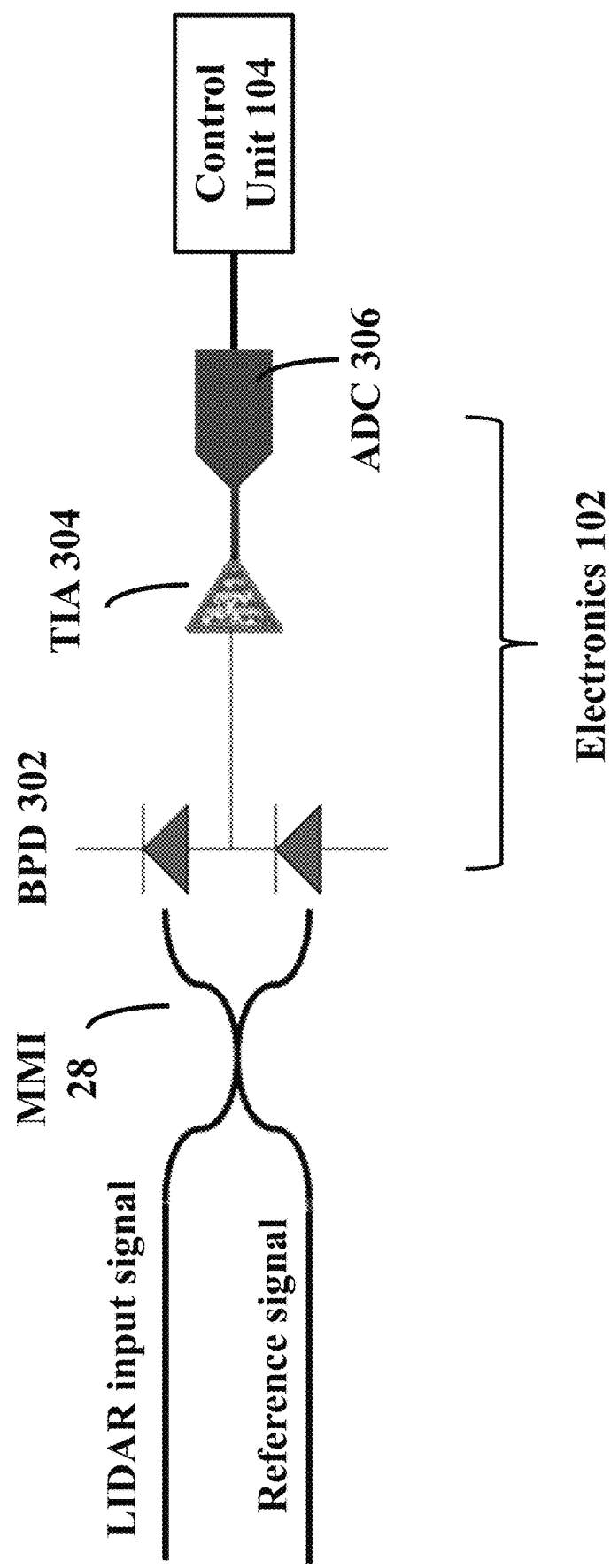
FIG. 3 shows an example illustration of electronics, control, and processing circuitry interfacing with a photonic component of the imaging device in accordance with various embodiments described herein.

FIG. 3 shows a schematic illustration of a portion of the LIDAR chip of FIG. 2 in communication with additional electronic, control, and/or processing circuitry. For example, the light combining component 28 (e.g., 2×2 MMI) of FIG. 2 may interface with a transducer element, such as the balanced photodetector (BPD) 302, and/or a transimpedance amplifier (TIA) 304 that is electrically connected to an analog-to-digital converter (ADC) 306 and the control unit 104.

The TIA 304 may be configured to convert the time varying photocurrent output of the balanced photodetector 302 arrangement into a time varying voltage signal or beat signal that has the beat frequency as described above with reference to FIG. 2. According to some embodiments, the beat signal may be largely sinusoidal and may be a function of at least the relative velocity between the LIDAR chip and the reflecting object. For example, if the LIDAR chip and the reflecting object are moving towards each other, the beat signal may increase in frequency and vice-versa. The beat signal can then serve as an input to the ADC 306 that samples the beat signal based on a predetermined sampling frequency to generate a sampled or quantized beat signal output. The predetermined sampling frequency may be based on a maximum range of operation of the LIDAR system. In some instances, the predetermined sampling frequency may be based on the maximum range of operation of the LIDAR system and a maximum relative velocity between the scanned target and the LIDAR chip. In some embodiments, the sampling frequency may vary between 100 MHz and 400 MHz. The sampled beat signal output of the ADC 306 may be electrically connected to the control unit 104 for estimating the beat frequency.

The balanced photodetector may comprise the light sensors 40 and 42 arranged in series as described above with respect to FIG. 2. The TIA 304 may be included on the LIDAR chip or separate from the LIDAR chip. The ADC 306 may be a discrete component or part of additional processing elements that may comprise a part of the control unit 104. In alternative embodiments, the 2×2 MMI 28 may be replaced by a 2×1 MMI as described above with respect to FIG. 2. The control unit 104 may include one or more DSPs, ASICs, FPGAs, CPUs, or the like.

Figure 4:
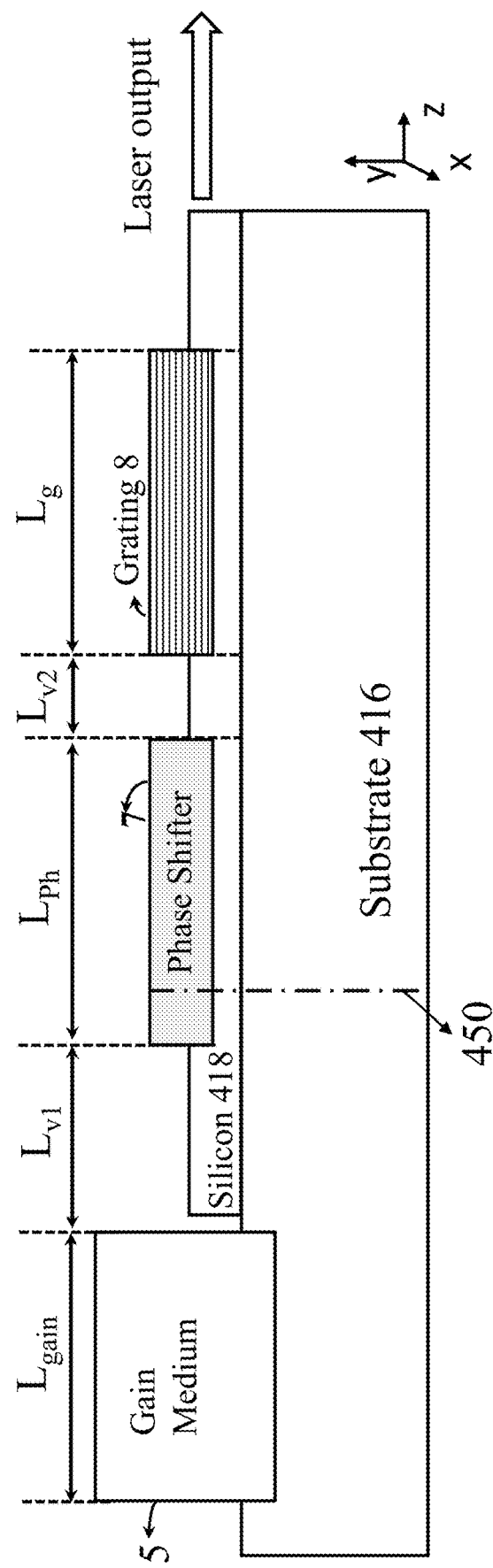
FIG. 4 show an example illustration of the ECL with the phase shifter in accordance with various embodiments described herein.

FIG. 4 shows an exemplary schematic illustration for the ECL 10 described in FIGS. 1 through 3. The ECL 10 may include the gain medium 5, the phase shifter 7, and grating 8 fabricated on a silicon-on-insulator (SOI) substrate 416. The dimensions of each component of the ECL 10 may be determined based on the required lasing wavelength, chirp bandwidth, chirp rate, and/or chirp linearity. A length of the phase shifter 7, shown as $L_{Ph}$, may vary between 1 μm and 10 mm. A width of the phase shifter may be based on the dimensions of the p-i-n structure shown in FIG. 5. The gain medium may have a length, $L_a$, and width, $W_a$ (not shown) varying between 100 μm and 10 mm. The gain medium may be comprised of various gain media such as indium phosphide (InP), indium gallium arsenide (InGaAs), and gallium nitride (GaN). The grating may have a length, $L_g$, and a width, $W_g$ (not shown), varying between 0.1 mm and 10 mm.

In some embodiments, the phase shifter 7 may be positioned between the gain medium 5 and the grating 8. The distance between the gain medium and the phase shifter may be given by $L_{v1}$. For example, $L_{v1}$ may vary between 100 μm and approximately 10 mm. In some embodiments, the phase shifter 7 may be positioned adjacent to the gain medium with approximately no spacing in between. The spacing between the phase shifter and the grating, shown as $L_{v2}$ in FIG. 4, may vary between approximately 100 μm and 10 mm. In some embodiments, the phase shifter 7 may be positioned adjacent to the grating with approximately no spacing in between. In some embodiments, a distance between the gain medium and the grating, such as $L_{v1}+L_{v2}+L_{VOA}$, may be approximately equal to the phase shifter length. In some embodiments, it may not be desirable to reduce the distance between the gain medium and the grating to approximately the phase shifter length because this may cause an increase in the linewidths of the ECL output. Therefore, it may be preferable to position the grating further away from the gain medium, such as at $(L_{v1}+L_{v2}+L_{VOA})$ varying between 800 μm and 12 mm to achieve narrow linewidths associated with the ECL output.

While the ECL 10 may be fabricated on an SOI wafer, other substrates such as can be used for fabricating an ECL with a phase shifter element that is similar in operation to the p-i-n phase shifter described herein. The gain medium 5 may include one or more reflective surfaces for re-directing reflected laser light back into the gain medium. In some embodiments, the gain medium 5 may include one or more anti-reflective surfaces for allowing transmission of the peak lasing wavelength while minimizing reflections of the peak lasing wavelength back into gain medium. In some embodiments, an intrinsic silicon region 418 may lie below the phase shifter and/or grating. In other embodiments, the phase shifter and/or the grating region may be fabricated directly above the oxide substrate with the overlying silicon region being completed etched away.

Figure 5:
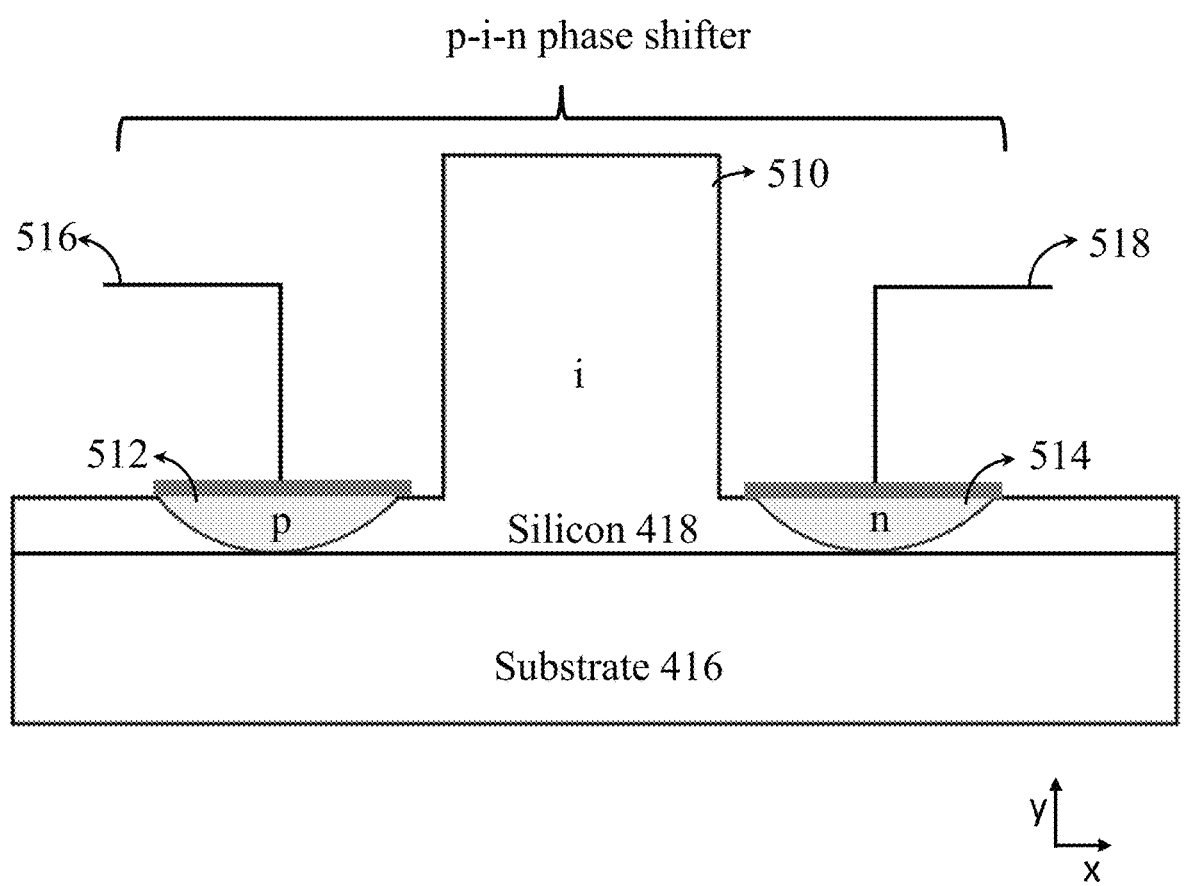
FIG. 5 shows a cross-sectional view of the ECL with the phase shifter of FIG. 4 in accordance with various embodiments described herein.

The LiDAR chip may include a first set of electrical contact pads that are electrically connected to the gain medium and a second set of electrical contact pads that are electrically connected to the p-i-n structure of the ECL 10. The p-i-n structure may include a corresponding set of metal contacts for providing the voltage bias. For example, the p-doped and the n-doped regions may each comprise a metal contact at a top surface as shown in FIG. 5 described below. The voltage bias to the phase shifter may then be applied via the second set of electrical contact pads that are electrically connected to the metal contacts of the p-i-n structure. The electronics 62 or other processing circuits that are located on-chip and/or off-chip may determine the voltage bias applied to the phase shifter. The same electronics and/or processing circuits may control the amplitude modulation associated with the laser drive current. For example, the same electronics and/or processing circuits may control the excitation of the gain medium and the voltage bias applied to the phase shifter. In other embodiments, the electronics 62 may control the laser drive current and different control electronics may control the operation of the phase shifter.

In some embodiments, the ECL 10 may include the gain medium 5 while the phase shifter 7 and the grating 8 may be fabricated along with the other photonic components of the PIC on the silicon-on-insulator (SOI) substrate 416. For example, the ECL 10 may be fabricated separately and the PIC comprising the photonic components, such as the waveguides, the interferometers, the grating, and the phase shifter may be fabricated separately.

FIG. 5 shows a cross-sectional view of the phase shifter 7 along the line labeled 450 of FIG. 4. The p-i-n structure comprises an intrinsic silicon ridge waveguide 510 that is surrounded on either side by the p-doped 512 and the n-doped 514 regions of the phase shifter. In some embodiments, the silicon wafer may be selectively etched to form the intrinsic ridge waveguide structure followed by selective doping to form the p-doped and the n-doped regions. The silicon ridge region may extend, along the y-axis of FIG. 5, above a top surface of p-doped and n-doped regions between 10 nm and 100 nm. A width of the silicon ridge waveguide may vary between approximately 0.1 µm and 10 µm. The dimensions of the silicon ridge waveguide may be determined based on the desired lasing wavelengths and/or polarizations of the ECL 10. For example, for generating a laser wavelength centered around 1550 nm that is polarized in the transverse electric (TE) direction, the silicon ridge waveguide would need to support a fundamental guided mode of approximately 1550 nm with an electric field propagating in a plane perpendicular (x-y plane of FIG. 4) to the direction of propagation that lies along the z-direction of FIG. 4.

In some embodiments, part of the overlying silicon region may be selectively etched leaving an underlying silicon region 418 beneath the intrinsic silicon region. In some embodiments, this silicon region 418 may extend to areas below the p-doped and the n-doped regions while in other instances, the p-doped and the n-doped regions may extend all the way to and/or into the underlying substrate region 416. The extent of dopant diffusion into the silicon 418 and/or the substrate 416 can vary depending upon process conditions and may vary from wafer-to-wafer. Metal contacts 516 and 518 that respectively connect the p-doped region and the n-doped region can be used to appropriate phase shifter bias control. In turn, the phase shifter bias can change the operation of the p-i-n phase shifter by either forward biasing or reverse biasing the junctions, thereby causing carrier injection or depletion. This changes the refractive index of the intrinsic silicon ridge waveguiding region and causes a change in the frequency of the laser emission from the ECL cavity.

As described earlier with respect to the FIG. 2, the ECL 10 can allow for separate control of the lasing wavelength and the frequency modulation or chirp associated with the lasing wavelength via excitation of the gain medium and biasing of the phase shifter, respectively. Control of the central lasing wavelength and the phase change in the laser cavity via two separate mechanisms enables increased laser stability, improved chirp linearity, and increased chirp bandwidths. For example, the ECL with the p-i-n phase shifter can operate at chirp bandwidths greater than 800 MHz up to several GHz with chirp linearities of less than 0.1 percent. This differs from the performance of an ECL with a maximum chirp bandwidth of approximately 1 GHz in which the gain medium is responsible for the lasing and the chirp modulation. For example, the gain medium may be excited with a constant DC bias and another separate voltage bias for modulating the frequencies of excitation. In this device, the chirp rate and the chirp bandwidth are limited due to a reliance on the thermal response of the gain medium to the varying bias voltage. For example, the chirp rate may be limited to a few hundred kHz.

Figure 6:
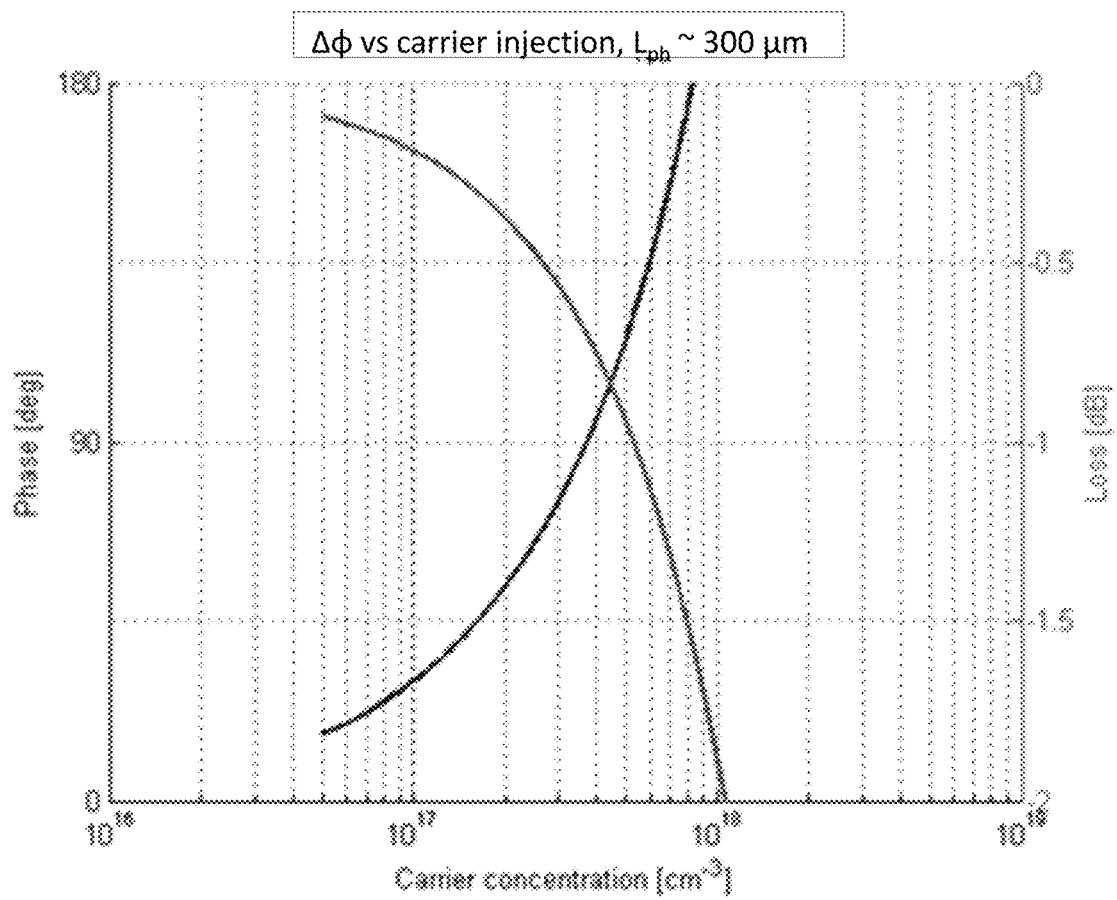
FIG. 6 shows a plot of phase change and optical loss versus injection current carrier concentration associated with the phase shifter in accordance with various embodiments described herein.

FIG. 6 shows a plot of phase shift and optical loss versus injection current carrier concentration associated with a phase shifter of length approximately equal to 300 µm. As the injection current increases, carrier concentration within the intrinsic region increases leading to a variation in the phase shift of the laser output. By application of a forward voltage bias (e.g., between 0.7 V and 1 V) to the p-i-n phase shifter, current begins to flow, leading to a change in carrier concentrations from approximately $10^{16}$ carriers/cm$^3$ to $10^{18}$ carriers/cm$^3$. The phase shift experienced by light passing through the phase shifter element may then vary between approximately 0 to 180° or π. A corresponding loss in optical power associated with the laser output may then decrease as the carrier concentration increases.

If the p-i-n phase shifter is reverse biased, almost no current will flow through the p-i-n region. The forward bias voltage applied to the phase shifter may be based on the dimensions of the phase shifter, such as the length, width, and depth.

Figure 7:
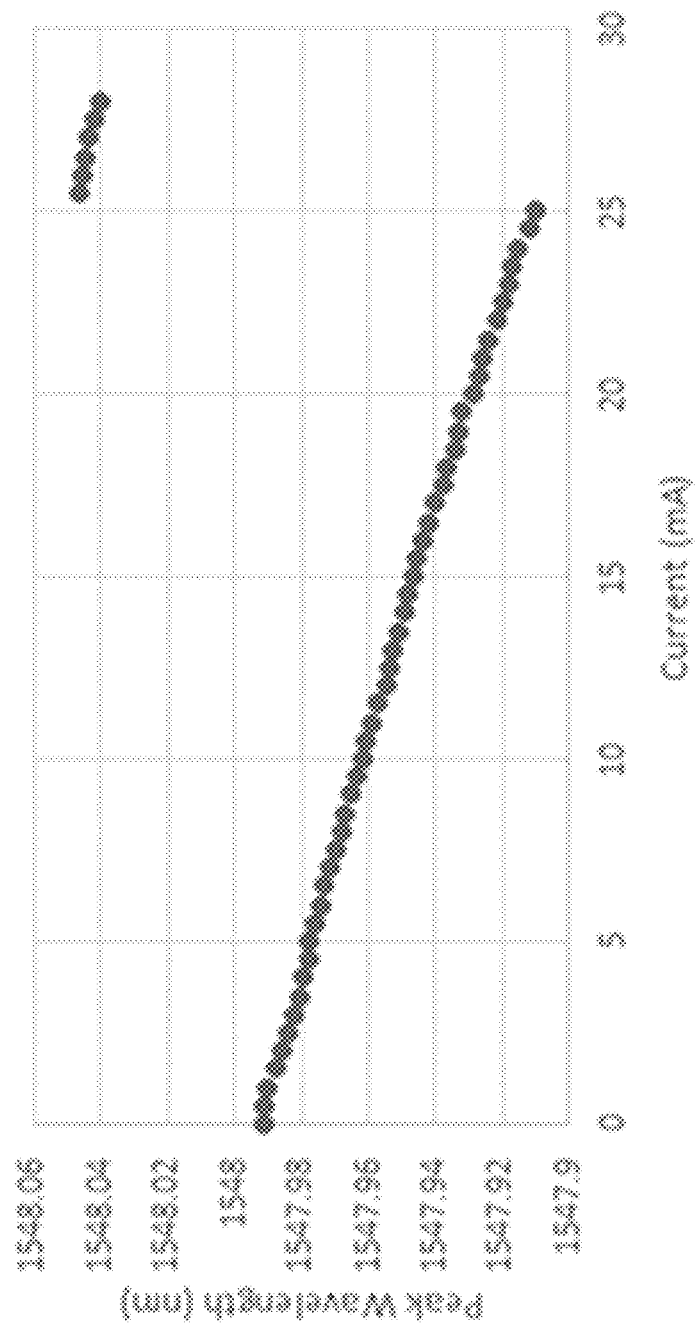
FIG. 7 shows a plot of peak wavelength emission versus current for the phase shifter in accordance with various embodiments described herein.

FIG. 7 shows a plot of peak wavelength emitted by the ECL versus injection current associated with the phase shifter for a laser drive current of approximately 10 mA peak-to-peak. As the injection current associated with the phase shifter increases from 0 mA to 25 mA, the peak lasing wavelength is seen to vary between approximately 1548 nm and 1547.9 nm. Increasing the injection current beyond 25 mA is seen to cause a mode hop in the operation of the ECL, leading to an abrupt change in the lasing mode supported by the ECL. This can cause the peak lasing wavelength to abruptly hop to a different center wavelength of approximately 1548.05 nm as shown in FIG. 7. While FIG. 7 shows that the ECL operation with the p-i-n phase shifter may be influenced by mode hops, design and/or fabrication optimizations can significantly ensure mode-hop free operation over extended wavelengths. For example, mode-hop free ECL operation over a wider wavelength range 0.1 nm to 5 nm may be possible by adjusting the ECL cavity length. The ECL cavity length may include $L_{v1}+L_{v2}+L_{Ph}+L_g$.

Figure 8A:
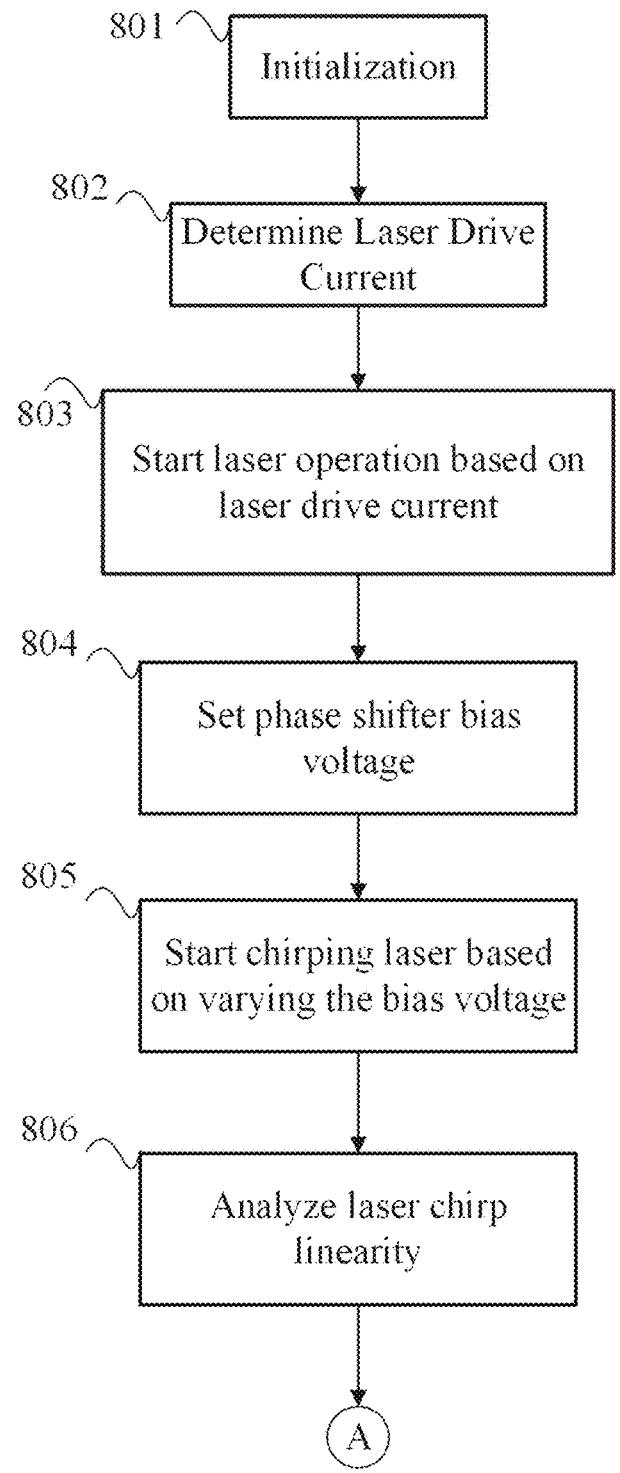
FIGS. 8A-8B show an exemplary flowchart in accordance with various embodiments described herein.
Figure 8B:
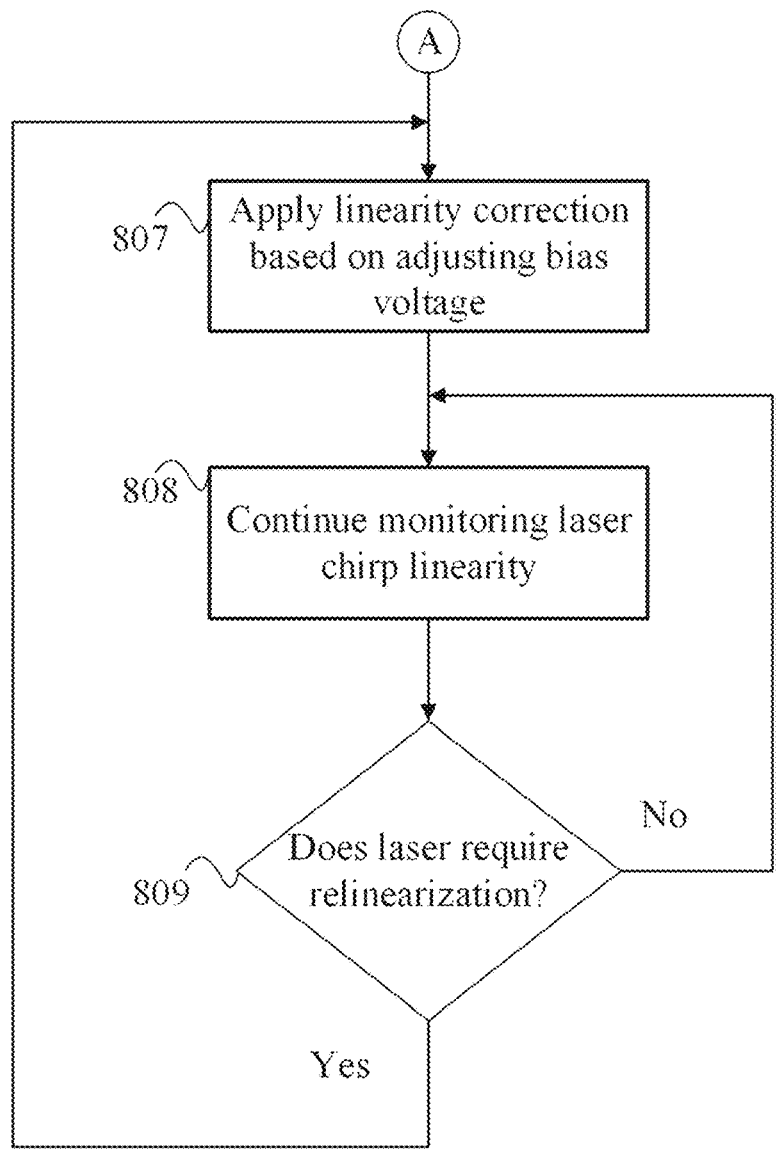

FIGS. 8A-8B show an exemplary flowchart for a method of operating the ECL 10. Steps 801-806 are shown in FIG. 8A and steps 807-809 are shown in FIG. 8B. At 801, the LiDAR system may initialize various parameters such as chirp durations, data cycles, sampling frequencies, chirp rates, chirp bandwidths, and ECL linearization parameters associated with the control of the ECL laser drive current, output power levels, and/or lasing frequencies of the outgoing LiDAR signal. The ECL linearization parameters may vary from one chirp duration to the next or across between two or more chirp durations. In some embodiments, the linearization parameters may vary from one data cycle to the next data cycle. The system may initialize some parameters based on a range of operation of the LiDAR system. For example, some of the parameters may be different for short range (less than 20 m), medium range (up to 50 m). and long range (greater than or equal to 50 m) of operation of the LiDAR system.

At 802, the system may select an optimum laser drive current depending upon the parameters initialized at 801. For example, if the ECL is to be operated for short-range imaging, the optimum laser drive current may be approximately 5 mA peak-to-peak. As another example, if the ECL is to be operated for long-range operation, the optimum laser drive current may be approximately 10 mA peak-to-peak so that the LiDAR output signal has greater power and can image over longer distances.

At 803, the system may turn ON the ECL based on the optimum laser drive current and/or the parameters initialized at 801 and 802. The ECL may then generate a constant LiDAR output signal over a fixed lasing frequency. At 804, the system may select an appropriate voltage bias control for the phase shifter depending upon various parameters described above such as a desired chirp rate, chirp bandwidth, chirp linearity, and/or chirp durations that comprise a single data cycle.

At 805, the system may control the phase shifter bias voltage such that the LiDAR output signal generated by the ECL is chirped over varying chirp durations, such as the up-chirp duration and the down-chirp duration described earlier with respect to FIGS. 1 to 4. For example, by varying the bias voltage between 0.7 V and 1 V, the ECL may generate a chirped LiDAR output varying between 1549 nm and 1550 nm for a laser drive current of 10 mA peak-to-peak. As another example, varying the bias voltage between 0.7 V and 1 V, the ECL may generate a chirped LiDAR output varying between 1310 nm and 1311 nm for a laser drive current of 10 mA peak-to-peak.

At 806, the system may monitor and/or analyze the chirp linearity associated with the LiDAR output signal. In some embodiments, if the chirp linearity were to satisfied a predetermined linearity threshold, the system may proceed to 807. For example, the system may determine that a chirp linearity greater than a 0.1% threshold linearity value is not satisfactory. This may be generally observed upon initializing and start of the ECL operation. The system may then proceed to 807 and apply a linearity correction to the ECL. The linearity correction may adjust the bias voltage in order to improve the chirp linearity associated with the output signal of the ECL or the LiDAR output signal. For example, the linearity correction may be based on a modified voltage bias waveform that re-linearizes the laser output wavelength. As another example, the linearity correction may be based on a linearity correction factor and the modified voltage bias waveform. In some embodiments, application of the linearity correction may decrease the chirp linearity to below 0.1%.

At 808, the system may continue monitoring the chirp linearity of the ECL output with respect to an expected chirped laser signal. If the system determines that the chirp linearity has degraded to above a predetermined threshold level (e.g., above 0.1%), the system may determine that re-linearization is required and proceed to 807. If the system determines that the chirp linearity has not degraded beyond the predetermined threshold level, the system may proceed to 808 and continue monitoring the chirp linearity associated with the ECL output signal.

Although FIGS. 2 and 3 describe a LiDAR system with one output waveguide and one input waveguide associated with a single on-chip ECL 10, the LiDAR system may comprise of any number of input waveguides for mitigating walk-off related effects. For example, the LIDAR system may be designed with one output waveguide and multiple input waveguides arranged above and below the output waveguide (along the same edge of the LiDAR chip) for improving the efficiency of receiving reflected LiDAR signals from further away that may otherwise be directed away from the receiving facet of the LiDAR chip due to continued rotation of the one or more mirrors of the scanning module 106.

Although the ECL 10 is disclosed in the context of a LIDAR system, the ECL 10 can be used in other applications such as autonomous vehicle technology, remote sensing, machine vision, and other emerging imaging applications.

The above-described example embodiments may be recorded in non-transitory computer-readable media including program instructions to implement various operations embodied by a processing system. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. The non-transitory computer readable media may also be a distributed network, so that the program instructions are stored and executed in a distributed fashion. The program instructions may be executed by one or more processors or computational elements. The non-transitory computer readable media may also be embodied in at least one application specific integrated circuit (ASIC) or Field Programmable Gate Array (FPGA), which executes (processes like a processor) program instructions. Examples of program instructions include both machine code, such as produced by a compiler, and files containing higher level code that may be configured to act as one or more software modules in order to perform the operations of the above-described example embodiments, or vice versa.

Although example embodiments have been shown and described, it would be appreciated by those skilled in the art that changes may be made in these example embodiments without departing from the principles and spirit of the disclosure, the scope of which is defined by the claims and their equivalents.

The invention claimed is:

1. A method for chirping a laser output wavelength, comprising: controlling, by a computing device, a laser drive current;
   selecting, by the computing device and based on the laser drive current, an initial voltage bias associated with a phase shifter element;
   analyzing, by the computing device, a chirp linearity associated with the laser output wavelength;
   varying, by the computing device and based on the chirp linearity, the initial voltage bias associated with the phase shifter element, wherein varying the initial voltage bias is based on: determining a linearity correction factor associated with the chirp linearity; and
   applying the linearity correction factor to a waveform of the initial voltage bias.

2. A method for chirping a laser output wavelength, comprising: controlling, by a computing device, a laser drive current;
   selecting, by the computing device and based on the laser drive current, an initial voltage bias associated with a phase shifter element;
   analyzing, by the computing device, a chirp linearity associated with the laser output wavelength;
   varying, by the computing device and based on the chirp linearity, the initial voltage bias associated with the phase shifter element;
   periodically monitoring the chirp linearity associated with the laser output wavelength;
   determining that the chirp linearity has satisfied a threshold linearity value;
   determining a modified voltage bias waveform based on the threshold linearity value; and applying the modified voltage bias waveform to the phase shifter element.

3. The method of claim 2, wherein the applying the modified voltage bias waveform to the phase shifter element re-linearizes the laser.

4. The method of claim 1, wherein the phase shifter element is a p-i-n based phase shifter.

5. A method for chirping a laser output wavelength, comprising: controlling, by a computing device, a laser drive current;
- selecting, by the computing device and based on the laser drive current, an initial voltage bias associated with a phase shifter element;
- analyzing, by the computing device, a chirp linearity associated with the laser output wavelength;
- varying, by the computing device and based on the chirp linearity, the initial voltage bias associated with the phase shifter element, wherein the chirp linearity is based on determining whether the laser output wavelength is varying linearly over time.

6. A system comprising:
at least one photonic integrated circuit (PIC) comprising:
- a laser configured to generate a laser output; and
- a phase shifter element configured to chirp the laser output based on varying a wavelength associated with the laser output; and
a computing device configured to:
- control a laser drive current associated with the laser;
- select, based on the laser drive current, an initial voltage bias associated with the phase shifter element;
- analyze a chirp linearity associated with the laser output; and
- vary, based on the chirp linearity, the initial voltage bias associated with the phase shifter element,
- vary the initial voltage bias based on:
  - determining a linearity correction factor associated with the chirp linearity; and
  - applying the linearity correction factor to a waveform of the initial voltage bias.

7. The system of claim 6,
at least one photonic integrated circuit (PIC) comprising:
- a laser configured to generate a laser output; and
- a phase shifter element configured to chirp the laser output based on varying a wavelength associated with the laser output; and
a computing device configured to:
- control a laser drive current associated with the laser;
- select, based on the laser drive current, an initial voltage bias associated with the phase shifter element;
- analyze a chirp linearity associated with the laser output;
- vary, based on the chirp linearity, the initial voltage bias associated with the phase shifter element;
- periodically monitor the chirp linearity associated with the laser output wavelength;
- determine that the chirp linearity has satisfied a threshold linearity value;
- determine a modified voltage bias waveform based on the threshold linearity value; and
- apply the modified voltage bias waveform to the phase shifter element.

8. The system of claim 7, wherein the applying the modified voltage bias waveform to the phase shifter element re-linearizes the laser.

9. The system of claim 6, wherein the phase shifter element is a p-i-n based phase shifter, and wherein the initial voltage bias is associated with application of a voltage across the p-i-n region.

10. A system comprising:
at least one photonic integrated circuit (PIC) comprising:
- a laser configured to generate a laser output; and
- a phase shifter element configured to chirp the laser output based on varying a wavelength associated with the laser output; and
a computing device configured to:
- control a laser drive current associated with the laser;
- select, based on the laser drive current, an initial voltage bias associated with the phase shifter element;
- analyze a chirp linearity associated with the laser output;
- vary, based on the chirp linearity, the initial voltage bias associated with the phase shifter element; and
- to determine the chirp linearity based on whether the wavelength associated with the laser output is varying linearly over time.

11. The system of claim 6, wherein the PIC further comprises a grating configured to control the wavelength associated with the laser output.

12. A system comprising:
an external cavity laser (ECL) configured to generate a laser output; a photonic integrated circuit (PIC) comprising:
- a phase shifter element configured to chirp the laser output based on varying a wavelength associated with the laser output; and
- a grating configured to control the wavelength associated with the laser output; and
a computing device configured to:
- control a laser drive current associated with the ECL;
- select, based on the laser drive current, an initial voltage bias associated with the phase shifter element;
- analyze a chirp linearity associated with the laser output;
- vary, based on the chirp linearity, the initial voltage bias associated with the phase shifter element;
- vary the initial voltage bias based on:
  - determining a linearity correction factor associated with the chirp linearity; and
  - applying the linearity correction factor to a waveform of the initial voltage bias.

13. A system comprising:
an external cavity laser (ECL) configured to generate a laser output a photonic integrated circuit (PIC) comprising:
- a phase shifter element configured to chirp the laser output based on varying a wavelength associated with the laser output; and
- a grating configured to control the wavelength associated with the laser output; and
a computing device configured to:
- control a laser drive current associated with the ECL;
- select, based on the laser drive current, an initial voltage bias associated with the phase shifter element;
- analyze a chirp linearity associated with the laser output;
- vary, based on the chirp linearity, the initial voltage bias associated with the phase shifter element;

periodically monitor the chirp linearity associated with the laser output;

determine that the chirp linearity has satisfied a threshold linearity value; and determine a modified voltage bias waveform based on the threshold linearity value; and apply the modified voltage bias waveform to the phase shifter element.

14. The system of claim 13, wherein the applying the modified voltage bias waveform to the phase shifter element re-linearizes the ECL.

15. The system of claim 12, wherein the phase shifter element is a p-i-n based phase shifter, and wherein the initial voltage bias is associated with application of a voltage across the p-i-n region.

16. A system comprising:
an external cavity laser (ECL) configured to generate a laser output a photonic integrated circuit (PIC) comprising:
  a phase shifter element configured to chirp the laser output based on varying a wavelength associated with the laser output; and
  a grating configured to control the wavelength associated with the laser output; and
a computing device configured to:
  control a laser drive current associated with the ECL;
  select, based on the laser drive current, an initial voltage bias associated with the phase shifter element;
  analyze a chirp linearity associated with the laser output;
  vary, based on the chirp linearity, the initial voltage bias associated with the phase shifter element; and
  determine the chirp linearity based on whether the wavelength associated with the laser output is varying linearly over time.

17. The system of claim 12, wherein the ECL includes a gain chip, and wherein the initial voltage bias controls an injection current associated with the phase shifter element.

18. The method of claim 1, further comprising:
periodically monitoring the chirp linearity associated with the laser output wavelength;

determining that the chirp linearity has satisfied a threshold linearity value;

determining a modified voltage bias waveform based on the threshold linearity value; and applying the modified voltage bias waveform to the phase shifter element.

19. The system of claim 6, wherein
the computing device is further configured to:
  periodically monitor the chirp linearity associated with the laser output wavelength;
  determine that the chirp linearity has satisfied a threshold linearity value;
  determine a modified voltage bias waveform based on the threshold linearity value; and
  apply the modified voltage bias waveform to the phase shifter element.

20. The system of claim 12, wherein
the computing device is further configured to:
  periodically monitor the chirp linearity associated with the laser output wavelength;
  determine that the chirp linearity has satisfied a threshold linearity value;
  determine a modified voltage bias waveform based on the threshold linearity value; and
  apply the modified voltage bias waveform to the phase shifter element.

* * * * *